United States Patent

Schweighofer

[11] Patent Number: 6,118,681
[45] Date of Patent: Sep. 12, 2000

[54] GRADIENT AMPLIFIER FOR A MAGNETIC RESONANCE TOMOGRAPHY APPARATUS AND METHOD FOR CONTROLLING SAME

[75] Inventor: Peter Schweighofer, Nuremberg, Germany

[73] Assignee: Siemens Aktiengesellschaft, Munich, Germany

[21] Appl. No.: 09/395,607

[22] Filed: Sep. 14, 1999

[30] Foreign Application Priority Data

Sep. 14, 1998 [DE] Germany .............. 198 42 033

[51] Int. Cl.[7] .............. H02M 5/42; H03K 3/017; G01R 33/20
[52] U.S. Cl. .............. 363/98; 327/172; 324/307
[58] Field of Search .............. 363/98, 21, 97, 363/89, 26, 15; 323/282, 284; 327/175, 172; 324/322, 307, 309

[56] References Cited

U.S. PATENT DOCUMENTS

| | | | |
|---|---|---|---|
| 4,437,053 | 3/1984 | Bax | 323/268 |
| 5,063,349 | 11/1991 | Roemer et al. | 324/322 |
| 5,111,378 | 5/1992 | Nowak et al. | 363/98 |
| 5,973,527 | 10/1999 | Schweighofer et al. | 327/172 |
| 6,034,565 | 3/2000 | Schweighofer | 330/10 |

FOREIGN PATENT DOCUMENTS

OS 197 06 756    9/1998    Germany.

Primary Examiner—Peter S. Wong
Assistant Examiner—Rajnikant B. Patel
Attorney, Agent, or Firm—Hill & Simpson

[57] ABSTRACT

In a gradient amplifier for a nuclear magnetic resonance tomography apparatus and a method for operating same, a reference value unit for providing a reference value for a gradient coil current, an actual value unit for determining an actual value of the gradient coil current, a control unit for determining a setting value, a modulator for generating at least one output stage drive signal and an output stage for generating an output signal across the coil are provided. The precision of the reference value and the precision of the actual value are higher by at least the factor of 10 than the precision of the setting value and/or of the at least one output stage drive signal and/or of the output signal. As a result, the gradient amplifier has a precision that is high enough to avoid disturbances affecting in the image can be realized with relatively little outlay.

22 Claims, 1 Drawing Sheet

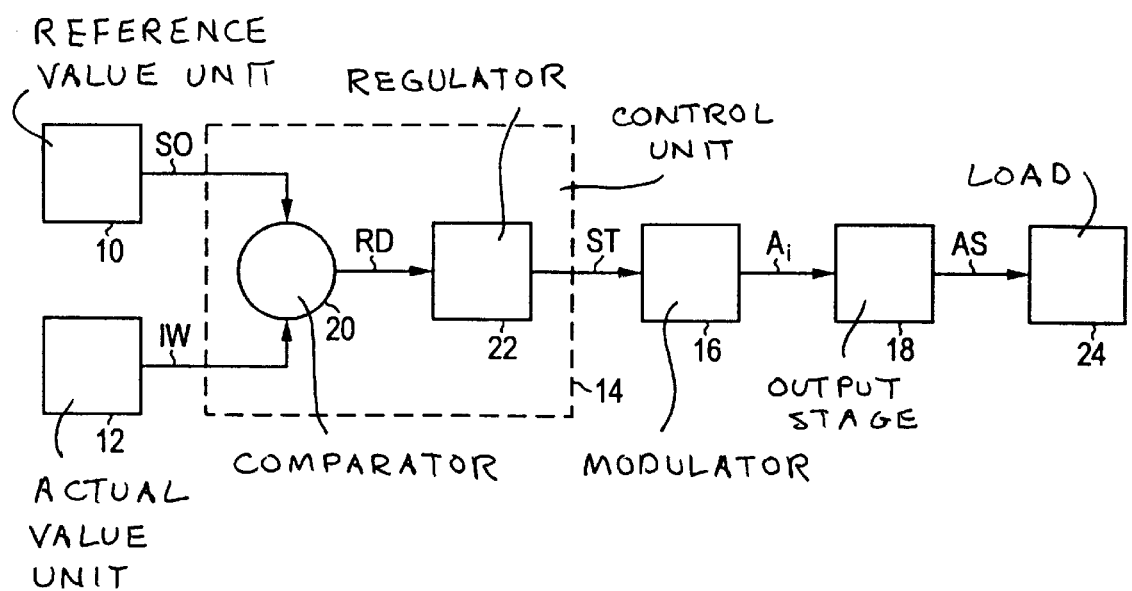

GRADIENT AMPLIFIER FOR A MAGNETIC RESONANCE TOMOGRAPHY APPARATUS AND METHOD FOR CONTROLLING SAME

BACKGROUND OF THE INVENTION

1. Field of the Invention

The present invention is directed to a gradient amplifier for a magnetic resonance tomography apparatus as well as a method for controlling a gradient amplifier of a nuclear magnetic resonance tomography apparatus.

2. Description of the Prior Art

In a magnetic resonance tomography apparatus, a magnetic field gradient is generated by a gradient coil which is in turn connected to a gradient amplifier. The gradient amplifier supplies voltages on the order of magnitude of a few hundred through a few thousand volts in order to produce an exactly regulated current in the gradient coil. This current fluctuates in a predetermined current curve, for example, between 0 and 300 A.

The current flowing through the gradient coil must be extremely precisely regulated. Deviations of only a few mA can already produce imaging disturbances.

German OS 40 24 160 (corresponding to U.S. Pat. No. 5,111,378) discloses a gradient amplifier as well as a method wherein a reference value and an actual value of the coil current are supplied to a control unit which generates a setting value dependent on the relationship between the reference value and the actual value, the control unit supplying the setting value to a modulator which produces at least one output stage drive signal therefrom, the modulator supplying the drive signal to an output stage to which the load is connected. Due to the high precision demands mentioned above, all components in this amplifier are designed for an extremely high stability and resolution in order to generate signals with a precision in the ppm range. This requires expensive signal components for the entire amplifier system and a complicated balancing in the manufacture as well as during every maintenance event.

German OS 197 06 756 discloses a gradient amplifier for a magnetic resonance tomography apparatus with a control means having a control input for a digital control word. A current transfer function of the control means can be selected from a number of predetermined transfer functions with the control word. As a result, the gradient amplifier can be simply set to different control characteristics without having the readjustment require a manual balancing.

SUMMARY OF THE INVENTION

An object of the present invention is to avoid the aforementioned problems and to provide a gradient amplifier as well as a control method with which the required precision can be achieved given optimally little outlay. In particular, the precision should be high enough in order to avoid degradation of the image generated by the nuclear magnetic resonance tomography apparatus.

The above object is achieved in accordance with the principles of the present invention in a gradient amplifier and a method for operating a gradient amplifier wherein a control unit generates a setting value dependent on a relationship between a reference value and an actual value of a load parameter supplied to the control unit, and wherein the setting value is modulated to obtain at least one output stage drive signal which is supplied to an output stage connected to the load, and wherein the precision of the reference value and of the actual value is higher by at least a factor of 10 than the precision of the setting value and/or the precision of the output stage drive signal, and/or the precision of the output signal itself.

The invention can be utilized in control circuits of gradient amplifiers in all technical realizations. In particular, the individual components can be fashioned as analog circuits, as digital circuits or as program modules of a processor (for example, of a digital signal processor DSP). Mixed forms of those technologies and other technical realizations are also possible.

The invention is based on the surprising perception that, without limiting the image quality, it is possible to design specific components of the control circuit of the gradient amplifier only for a relatively slight precision. This is particularly true of the output stage of the gradient amplifier and of components that are connected just before the output stage in the direction of the signal flow.

These components need only be designed for a significantly lower precision than in known gradient amplifiers, so that considerable savings are possible. This is true for all of the aforementioned technologies for realizing the control circuit. Components of the control circuit that are constructed as an analog circuit can exhibit higher tolerances and are less critical in the balancing. Digital circuits require fewer connecting lines given lower precision, or lower clock rates. Components of the control circuit that are designed as program modules of a processor require less computing capacity. The savings achieved by the invention are particularly significant in modern high-performance gradient amplifiers that must meet high power and precision demands.

In accordance with the invention the precision of the reference value and the precision of the actual value are higher by at least a factor of 10 than the precision of the setting value and/or of the at least one output stage drive signal and/ur of the output signal. In preferred embodiments, this factor is higher and amounts to at least 50 or to at least 100 or to at least 200. The savings that can be achieved are then especially high.

The output stage, and possibly an uninterrupted chain of components that just preceding the output stage in the signal flow direction preferably exhibit the abovespecified, lower precision. In other words, either only the output stage or the output stage, and the modulator or the output stage and the modulator, and the control unit are preferably designed for the lower precision.

As used herein "precision" means the usable resolution of a signal, i.e., for example, the number of signal statuses (levels) that are stable and can be distinguished. The precision of a signal can thus be indicated by the unit "bit". This is dependent on whether a signal path is analog or digital or is realized by a data exchange between program modules. In typical gradient amplifiers of the prior art, the precision of all signals of the feedback loop amounts to approximately 18 bits, i.e., approximately $2^{18}=262144$ different signal levels are resolved and are essentially stable.

In a preferred development of the invention the precision or resolution of the reference value and of the actual value is between 14 bits and 22 bits, particularly between 16 bits and 20 bits and preferably approximately 18 bits. The output signal of the output stage preferably has a precision or resolution between 6 bits and 14 bits, particularly between 8 bits and 12 bits. Further, the precision or resolution of the at least one output stage drive signal as well as that of the output signal of the output stage is preferably defined. In this case, it is also advantageous to select the precision or resolution of the setting value to be the same as that of the output signal of the output stage.

The control unit preferably includes a comparator for determining a control difference and a regulator for determining the setting value. The precision or resolution of the control difference is preferably selected to bet the same as the setting value.

DESCRIPTION OF THE DRAWINGS

The single FIGURE shows a block circuit diagram of an inventive gradient amplifier as well as a load connected thereto.

DESCRIPTION OF THE PREFERRED EMBODIMENTS

The gradient amplifier includes a control circuit that is formed of a reference value unit 10, of an actual value means 12, of a control unit 14, a modulator 16 and an output stage 18. The control unit 14 in turn includes a comparator 20 and a regulator 22. The output stage 18 is connected to a gradient coil acting as a mainly inductive load 24. Apart from the precision demands and tolerances of the individual components, a gradient amplifier according to the FIGURE is known.

In the exemplary embodiment described herein, the control circuit is constructed with analog circuits. In alternative embodiments, however, digital circuits are employed or the components of the control circuit are fashioned as program modules of a digital signal processor. Further, these three basic types can be arbitrarily combined.

During operation of the gradient amplifier, the reference value unit 10 generates a signal that represents the reference value SO of the current flowing through the load 24. The reference value SO thus indicates the desired curve of the current of the load current. The same shape of the current curve can, for example, be contained in a memory table of the reference value unit 10.

The actual value unit 12 that, for example, can be an inductive plug-through converter or a low impedance resistor connected into the load circuit, determines the existing actual value IW of the current flux through the load 24 and supplies this as an output to the control unit 14.

The reference value unit 10 and the actual value unit 12 each exhibit a precision, i.e. a stable, usable resolution, of approximately 18 bits.

The control unit 14 generates a setting value ST from the reference value SO and the actual value IW according to a known regulating method. To that end, the comparator 20 forms the difference between the reference value SO and the actual value IW that is referred to as control difference RD. The regulator 22 determines the setting value ST from the control difference RD according to a predetermined transfer characteristic.

In the exemplary embodiment described herein, the control difference RD and the setting value ST are determined with a precision of 8 through 12 bits. The comparator 20 can operate with an internal precision of 18 bits or, likewise, of 8 through 12 bits.

In an alternative embodiments that is particularly suited for a realization with a digital signal processor, by contrast, the setting value ST can be directly derived from the reference value SO and the actual value IW without a control difference RD being formed first. To that end, the signal processor can evaluate a suitable equation.

In a further alternative embodiment the setting value ST can be generated with the high precision of approximately 18 bits. The modulator 16 and the output stage 18 then are designed for a lower precision, so that considerable savings still are achieved in this case.

The modulator 16 generates drive signals A for the output stage 18 from the setting value ST. The output stage 18 in the exemplary embodiment described herein can be an H-bridge circuit with four switch elements as disclosed, for example, in German OS 40 24 160. Accordingly, four output stage drive signals $A_1, A_2, A_3$ and $A_4$ are provided for the separate drive of each switch element according to a known pulse width modulation method. Such a method is likewise disclosed, for example, in German OS 40 24 160.

In alternative embodiments, other modulation methods and other designs of the output stage 18 can be utilized. For example, the output stage 18 can be formed by a number of output modules each having an H-bridge circuit that are connected in series at the output side. In this case, correspondingly more output stage drive signals A are provided for the individual switch elements of the output stage modules.

The output stage drive signals $A_i$ each exhibit a relatively low precision of 8 through 12 bits. Since each output stage drive signal $A_i$ in the exemplary embodiment is a binary signal with a width of 1 bit, the term "precision" here refers to the time resolution and stability of the signal edges, i.e. to the on and off points in time of the switch elements in the output stage 18.

The output signal AS generated by the output stage 18, i.e. the current flowing through the load 24, likewise has a precision of 8 through 12 bits. As a result, the power semiconductors of the output stage 18 can be selected with higner tolerances and balancing.

A gradient was constructed according to the FIGURE with all components, designed for a high precision of approximately 18 bits. The time resolution of the output stage drive signals $A_i$ was then limited by the switching edges of these signals being quantized by a flip-flop circuit into a fixed time grid of a 32 MHZ clock. The switching frequency of the pulse-width modulated output stage 18 amounted to 100 kHz, so that only 320 different switching time lengths were available. Taking the operational sign of the voltage into consideration, this yields 640 possibilities or 9.3 bits. Despite this limitation in precision, no disturbances affecting in the image could be identified even in extremely sensitive magnetic resonance experiments.

When the precision, as provided in preferred embodiments of the invention is limited in a number of components of the control circuit, the individual errors of the components can propagate to the next stage. The precision of the output signal AS given the design of the individual components recited in this specification, however, is high enough in order to avoid such errors from taking effect. This is particularly true when the stages with lower precision have an approximately linear transfer characteristic.

Although modifications and changes may be suggested by those skilled in the art, it is the intention of the inventor to embody within the patent warranted hereon all changes and modifications as reasonably and properly come within the scope of his contribution to the art.

I claim as my invention:

1. A gradient amplifier for a magnetic resonance tomography apparatus, comprising:

an output stage adapted for connection to a load, said load having a load parameter associated therewith;

a reference value source which emits a signal representing a reference value for said load parameter;

an actual value unit which determines an existing, actual value of said load parameter and which generates a signal representing said actual value;

a control unit supplied with said signal representing said reference value and said signal representing said actual value, said control unit determining a setting value dependent on a relationship between said reference value and said actual value;

a modulator connected to said control unit and supplied with said setting value, said modulator generating an output stage drive signal dependent on said setting value;

said output stage being connected to said modulator and receiving said output stage drive signal therefrom and generating an output signal for supply to said load dependent on said output stage drive signal;

said reference value source generating said signal representing said reference value with a precision that is higher by at least a factor of 10 than a precision of at least one of said setting value, said output stage drive signal and said output signal; and said actual value unit generating said signal representing said actual value with a precision that is higher by at least a factor of 10 than a precision of at least one of said setting value, said output stage drive signal and said output signal.

2. A gradient amplifier as claimed in claim 1 wherein said reference value source generates said signal representing said reference value with a precision that is higher by at least a factor of 100 than a precision of at least one of said setting value, said output stage drive signal and said output signal, and wherein said actual value unit generates said signal representing said actual value with a precision that is higher by at least a factor of 100 than a precision of at least one of said setting value, said output stage drive signal and said output signal.

3. A gradient amplifier as claimed in claim 1 wherein said reference value source generates said signal representing said reference value with a resolution in a range between 16 and 20 bits and wherein said actual value unit generates said signal representing said actual value with a resolution between 16 and 20 bits.

4. A gradient amplifier as claimed in claim 3 wherein said reference value source generates said signal representing said reference value with a resolution of approximately 18 bits and wherein said actual value unit generates said signal representing said actual value with a resolution of approximately 18 bits.

5. A gradient amplifier as claimed in claim 3 wherein said control unit generates said setting value with a resolution in a range between 6 and 14 bits.

6. A gradient amplifier as claimed in claim 5 wherein said control unit generates said setting value with a resolution in a range between 8 and 12 bits.

7. A gradient amplifier as claimed in claim 3 wherein said modulator generates said output stage drive signal with a resolution in a range between 6 and 14 bits.

8. A gradient amplifier as claimed in claim 7 wherein said modulator generates said output stage drive signal with a resolution in a range between 8 and 12 bits.

9. A gradient amplifier as claimed in claim 3 wherein said output stage generates said output signal with a resolution in a range between 6 and 14 bits.

10. A gradient amplifier as claimed in claim 9 wherein said output stage generates said output signal with a resolution in a range between 8 and 12 bits.

11. A gradient amplifier as claimed in claim 1 wherein said control unit comprises:

a comparator supplied with said signal representing said reference value and said signal representing said actual value, said comparator determining a control difference between said reference value and said actual value;

a regulator supplied with said control difference which determines said setting value dependent on said control difference; and said comparator generating said control difference with a precision which is lower by at least a factor of 10 than said precision of said signal representing said reference value and said precision of said signal representing said actual value.

12. A method for operating a gradient amplifier of a magnetic resonance tomography apparatus, comprising the steps of:

connecting an output stage to a load, said load having a load parameter associated therewith;

generating a signal representing a reference value for said load parameter;

determining an existing, actual value of said load parameter and generates a signal representing said actual value;

determining a setting value dependent on a relationship between said reference value and said actual value;

generating an output stage drive signal dependent on said setting value;

generating an output signal for supply to said load dependent on said output stage drive signal;

generating said signal representing said reference value with a precision that is higher by at least a factor of 10 than a precision of at least one of said setting value, said output stage drive signal and said output signal; and generating said signal representing said actual value with a precision that is higher by at least a factor of 10 than a precision of at least one of said setting value, said output stage drive signal and said output signal.

13. A method as claimed in claim 12 comprising generating said signal representing said reference value with a precision that is higher by at least a factor of 100 than a precision of at least one of said setting value, said output stage drive signal and said output signal, and generating said signal representing said actual value with a precision that is higher by at least a factor of 100 than a precision of at least one of said setting value, said output stage drive signal and said output signal.

14. A method as claimed in claim 12 comprising generating said signal representing said reference value with a resolution in a range between 16 and 20 bits and generating said signal representing said actual value with a resolution between 16 and 20 bits.

15. A method as claimed in claim 14 comprising generating said signal representing said reference value with a resolution of approximately 18 bits and generating said signal representing said actual value with a resolution of approximately 18 bits.

16. A method as claimed in claim 14 comprising generating said setting value with a resolution in a range between 6 and 14 bits.

17. A method as claimed in claim 16 comprising generating said setting value with a resolution in a range between 8 and 12 bits.

18. A method as claimed in claim 14 comprising generating said output stage drive signal with a resolution in a range between 6 and 14 bits.

19. A method as claimed in claim 18 comprising generating said output stage drive signal with a resolution in a range between 8 and 12 bits.

20. A met hod as claimed in claim 14 comprising generating said output signal with a resolution in a range between 6 and 14 bits.

21. A method as claimed in claim 20 comprising generating said output signal with a resolution in a range between 8 and 12 bits.

22. A method as claimed in claim 12 comprising:

comparing said signal representing said reference value and said signal representing said actual value, and identifying a control difference between said reference value and said actual value;

determining said setting value dependent on said control difference; and identifying said control difference with a precision which is lower by at least a factor of 10 than said precision of said signal representing said reference value and said precision of said signal representing said actual value.

* * * * *